United States Patent [19]

Kitamura et al.

[11] Patent Number: 5,399,973

[45] Date of Patent: Mar. 21, 1995

[54] METHOD AND APPARATUS FOR DETECTING A REDUCTION IN THE DEGREE OF VACUUM OF A VACUUM VALVE WHILE IN OPERATION

[75] Inventors: Tadao Kitamura; Toshio Kobayashi; Yukio Osawa; Noboru Usui; Mamoru Yamada, all of Kawasaki, Japan

[73] Assignee: Fuji Electric Co., Ltd., Kanagawa, Japan

[21] Appl. No.: 38,200

[22] Filed: Mar. 26, 1993

[30] Foreign Application Priority Data

| Apr. 2, 1992 | [JP] | Japan | 4-080091 |
| Jun. 12, 1992 | [JP] | Japan | 4-152527 |
| Feb. 1, 1993 | [JP] | Japan | 5-014759 |

[51] Int. Cl.$^6$ ............ G01R 31/02; H01H 33/26
[52] U.S. Cl. ............ 324/424; 200/144 B; 361/129; 324/460; 324/409
[58] Field of Search ............ 324/424, 460, 463, 127, 324/409; 361/2, 1, 129; 200/146 AA, 144 B, 144 R

[56] References Cited

U.S. PATENT DOCUMENTS

| 2,864,998 | 12/1958 | Lee. | |
| 3,026,394 | 3/1962 | Jennings | 200/144 B |
| 3,048,681 | 8/1962 | Polinko | 200/144 B |
| 4,471,309 | 9/1984 | Lange et al. | 324/424 |
| 4,896,008 | 1/1990 | Aoki et al. | 200/144 B |
| 4,937,698 | 6/1990 | Toya et al. | 200/144 B |

FOREIGN PATENT DOCUMENTS

| 2416324 | 4/1974 | Germany. |
| 2743755C2 | 9/1977 | Germany. |
| 0079181A1 | 5/1983 | Germany. |
| 3643672C2 | 12/1986 | Germany. |
| 257296A1 | 1/1987 | Germany. |
| 3702009A1 | 1/1987 | Germany. |
| 3733107A1 | 9/1987 | Germany. |
| 3743868A1 | 12/1987 | Germany. |
| 3837605A1 | 11/1988 | Germany. |
| 0365005A2 | 4/1990 | Germany. |
| 59-46725 | 3/1984 | Japan. |
| 59-46726 | 3/1984 | Japan. |
| 59-175524 | 10/1984 | Japan. |
| 64-76630 | 3/1989 | Japan. |
| 2-114413 | 4/1990 | Japan. |

OTHER PUBLICATIONS

"Partial Discharge Measurement General", Electric Society, Electric Standard Investigative Committee Standard, JEC-195, pp. 1, 4 & 24, 1980.
Patent Abstracts of Japan, *Vacuum Pressure Measuring Device For Vacuum Circuit Breaker Vacuum Bulb*, Y. Kogushi, Aug. 24, 1992, vol. 16/No. 397.
Patent Abstracts of Japan, *Inspecting Device For Degree of Vacuum of Vacuum Breaker*, T. Takashima, Sep. 20, 1983, vol. 7/No. 212.

*Primary Examiner*—Kenneth A. Wieder
*Assistant Examiner*—Jay M. Patidar
*Attorney, Agent, or Firm*—Finnegan, Henderson Farabow, Garrett & Dunner

[57] ABSTRACT

An improved vacuum valve including an insulating container and an arc shield held in the insulating container, wherein a protrusion is formed on either the outer cylindrical surface of the arc shield or on the inner surface of the container. A detecting electrode is set confronted with the outer surface of the insulating container with an air gap therebetween, and is grounded through a current sensor. The current sensor detects a discharge current which is induced through the protrusion when the degree of vacuum of the vacuum valve is reduced, to output a detection signal. In response to the detection signal, a signal processing unit outputs an alarm signal indicating the reduction in the degree of vacuum of the vacuum valve. Thus, while the vacuum valve is in operation, its vacuum reduction can be positively detected with the vacuum valve maintained unchanged in reliability.

12 Claims, 8 Drawing Sheets

METHOD AND APPARATUS FOR DETECTING A REDUCTION IN THE DEGREE OF VACUUM OF A VACUUM VALVE WHILE IN OPERATION

BACKGROUND OF THE INVENTION

1. Field of the Invention

This invention relates to a method of detecting a reduction in the degree of vacuum of a vacuum valve which is employed in a vacuum circuit breaker or vacuum contactor, and a device for practicing the method.

2. Description of the Related Art

FIG. 6 is a side view showing a vacuum circuit breaker. The circuit breaker comprises a vacuum valve 1 with a stationary lead 7, and a movable lead 8. The movable lead 8 is connected through an insulating rod 20 to one end of an operating lever 21, the other end of which is coupled to an operating unit (not shown) which is accommodated in an insulating frame 13. The movable lead 8 is further connected through a flexible wire 22 to a main circuit terminal 23. The stationary lead 7 is connected to another main circuit terminal 24. Those main circuit terminals 23 and 24 are connected to insulators 25 and 26, respectively. The vacuum circuit breaker is of pull-out type, and the lower end portion of the insulating frame 13 is mounted through wheels 27 on the frame 28 of a power board. That is, when the vacuum circuit breaker is moved right and left in FIG. 1, clips 23A and 24A connected to the ends of the main circuit terminals 23 and 24 are connected to and disconnected from the main circuit bus lines (not shown).

FIG. 7 is a sectional view showing essential components of the vacuum circuit breaker shown in FIG. 6. In the vacuum valve 1, the stationary electrode 2 and the movable electrode 3 form contact means, and an arc shield 4 surrounds the contact means. The contact means and the arc shield 4 are built in a cylindrical insulating container 5. The container 5 is sealingly closed with lids 6A and 6B at both ends, and the inside of the container is evacuated high in the degree of vacuum. The stationary electrode 2 is fixedly secured to the bottom 6A, and it is electrically connected through the stationary lead 7 to an external circuit. The arc shield 4 is fixedly mounted on the lid 6A. The arc shield 4 is to prevent the metal vapor from sticking onto the inner cylindrical surface of the insulating container 5 which is produced by arcs formed at the contact means when the circuit is shut off. In the vacuum valve 1 shown in FIG. 7, the arc shield 4 is mounted on the lid 6A; however, it may be mounted on the lid 6B, or it may be provided at the middle of the container 5 in such a manner that it is insulated from the two lids 6A and 6B. FIG. 7 shows the vacuum valve with the contact means closed.

The vacuum valve 1 is hermetically sealed so that the vacuum pressure in the insulating container 5 is smaller than $10^{-4}$ Torr. If the sealing of the insulating container is impaired; that is, if the vacuum pressure in the insulating container 5 is raised, the vacuum valve 1 is lowered in breaking characteristic and in insulating characteristic, and therefore it is no longer useful. Thus, detection of the degree of vacuum of the vacuum valve 1 is essential for maintenance of the vacuum circuit breaker.

Heretofore, in order to detect the degree of vacuum of the vacuum valve thereby to determine whether or not the sealing of the latter is satisfactory, high voltage is applied across the contact means which is held open; that is, a withstand voltage test is given to the latter. This method is based on the fact that the flashover voltage of the contact means is decreased as the vacuum pressure decreases.

However, the above-described conventional method is disadvantageous in that, in order to test the vacuum valve, the latter must be disconnected from the main circuit. More specifically, in order to apply high voltage to the vacuum valve, the vacuum valve must be disconnected from the main circuit by pulling it out of the power board. Hence, the maintenance takes lots of time and labor, and the electric current is cut off for a long period of time.

The degree of vacuum of the vacuum valve may be measured with a vacuum meter connected to it. However, this method suffers from the following difficulties: As was described above, it is essential to maintain the degree of vacuum of the vacuum valve high. Hence, in connecting the vacuum meter to the vacuum valve under test, it is necessary to positively prevent the sealing of the vacuum valve from being impaired at the connecting point of the vacuum meter. At worst, the connection of the vacuum meter to the vacuum valve may lower the reliability of the latter. Thus, the method of measuring the degree of vacuum with the vacuum meter is not practical.

SUMMARY OF THE INVENTION

Accordingly, an object of this invention is to make it possible to detect a reduction in the degree of vacuum of a vacuum valve which is in operation, without lowering the reliability of the latter.

More specifically, an object of the invention is to provide a method of detecting a reduction in the degree of vacuum of a vacuum valve which is in operation, without lowering the reliability of the latter, and a device for practicing the method.

According to an aspect of the invention there is provided a method of detecting a reduction in the degree of vacuum of a vacuum valve comprising: an insulating container which is evacuated; contact means made up of a movable electrode and a stationary electrode; and an arc shield, the contact means and arc shield being set in the insulating container in such a manner that the arc shield surrounds the contact means; in which the arc shield is held at the same potential as one of the movable and stationary electrodes, a protrusion is formed on the outer cylindrical surface of the arc shield or on the inner surface of the insulating container, and a detecting electrode is set confronted with the outer surface of the insulating container with an air gap therebetween, and grounded through a current sensor, the current sensor detecting a discharge current which is induced through the protrusion when the degree of vacuum of the vacuum valve is reduced, thereby to detect the reduction in the degree of vacuum of the vacuum valve.

According to another aspect of the invention, there is provided a device for detecting a reduction in the degree of vacuum of a vacuum valve comprising: an insulating container which is evacuated; contact means made up of a movable electrode and a stationary electrode; and an arc shield, the contact means and arc shield being set in the insulating container in such a manner that the arc shield surrounds the contact means, which comprises: a protrusion formed on the outer cylindrical surface of the arc shield which is at the same potential as one of the movable and stationary electrodes; a detecting electrode confronted with the outer surface of the insulating container with an air gap therebetween, and grounded through a current sensor, the current sensor detecting a discharge current which is induced through the protrusion when the degree of vacuum of the vacuum valve is reduced, to provide an output; and a signal processing unit which, in response to the output of the current sensor, to output an alarm signal to indicate the reduction in the degree of vacuum of the vacuum valve.

In the device, the protrusion is a contact spring of metal which is held in contact with the inner surface of the insulating container.

In the device, the current sensor is a current transformer having a primary winding on the input side and a secondary winding on the output side, the secondary winding is shunted by a resonance capacitor, and the current transformer outputs a signal tuned to a particular frequency component in a frequency range of from 100 kHz to 200 kHz of the discharge current.

Furthermore in the device, the current sensor is made up of first and second current transformers each having a primary winding on the input side and a secondary winding on the output side, one terminal of the primary winding of the firs current transformer is connected to the detecting electrode, and the other terminal is connected to the primary winding of the second current transformer, and the secondary windings of the current transformers are shunted with resonance capacitors, respectively. The first current transformer outputs a signal tuned to a particular frequency component in a frequency range of from 100 kHz to 200 kHz, while the second current transformer outputs a signal tuned to a particular frequency component in a frequency range of from 1 MHz to 10 MHz, and the levels of the output signals of the first and second current transformers are subjected to comparison, to output an alarm signal indicating an amount of reduction in the degree of vacuum of the vacuum valve.

According to the invention, the protrusion is formed on the outer cylindrical surface of the arc shield which is held at the same potential as one of the movable and stationary electrodes, or on the inner surface of the insulating container, and the detecting electrode is set confronted with the outer surface of the insulating container with an air gap therebetween. Therefore, with the air gap set to a suitable value, the electric field in the vacuum valve is increased greatly at the end of the protrusion when the operating voltage is applied to the vacuum valve. When the vacuum valve is reduced in the degree of vacuum; that is, the degree of vacuum of the insulating container is decreased, the dielectric strength in vacuum is decreased. However, in the vacuum tube, the high electric field exists locally at the end of the protrusion as was described above, and therefore breakdown occurs only in the vacuum space at the end of the protrusion (not occurring abruptly in the whole space in the vacuum valve), so that partial discharges are induced there.

When, as was described above, the partial discharges are induced with the protrusion formed in the vacuum valve, a discharge current including high frequency components flows. More specifically, the discharge current flows to the detecting electrode through electrostatic capacities formed by the insulating container, the vacuum space, the air gap, etc. On the other hand, the detecting electrode is grounded through the current sensor, the output of which is connected to the signal processing unit. Therefore, upon detection of the discharge current, the sensor applies a detection signal to the signal processing unit. In response to the detection signal, the signal processing unit outputs the alarm signal indicating the reduction in the degree of vacuum of the vacuum signal.

The protrusion formed on the arc shield is held in contact with the inner surface of the insulating container. Since at the contact region, the electric field is made extremely high, a range of vacuums with which partial discharges are induced is increased, and accordingly a reduction in the degree of vacuum can be detected with higher sensitivity.

Furthermore, the contact spring of metal is employed as the protrusion. When the arc shield is inserted into the insulating container, the contact spring is positively held in contact with the insulating container, which allows discharges to be induced stably when the degree of vacuum of the vacuum valve is decreased.

Furthermore, the current transformer is employed as the current sensor, according to the invention. The primary winding of the current transformer is connected to the detecting electrode, and the secondary winding is shunted with the resonance capacitor which resonates with a particular frequency in a range of from 100 kHz to 200 kHz, and connected to the signal processing unit. The current transformer, being tuned to the particular signal, outputs the electrical signal through the secondary winding. When the degree of vacuum of the vacuum valve is decreased, or the vacuum pressure changes so that the dielectric strength is minimum, the high frequency components of the discharge current are lessened, so that the remaining high frequency components are of 100 kHz to 200 kHz. Hence, by tuning the current sensor to the particular frequency components in the range of frequencies of from 100 kHz to 200 kHz, a vacuum reduction of the vacuum tube can be positively detected irrespective of the vacuum pressure of the vacuum tube.

Furthermore, according to the invention, the current sensor is made up of the first and second current transformers. One terminal of the primary winding of the first current transformer is connected to the detecting electrode, and the other terminal is connected to the primary winding of the second current transformer, and the secondary windings of the current transformers are shunted with the resonance capacitors, and connected to the signal processing units, respectively. One of the capacitors is tuned to a particular frequency component in a frequency range of from 100 kHz to 200 kHz, while the other is tuned to a particular frequency component in a frequency range of from 1 MHz to 10 MHz, so that the current transformers output electrical signals tuned to those particular frequency components, respectively, which are applied to the comparator. The comparator subjects the levels of the output signals of the two current transformers to comparison, to output the signal indicating an amount of reduction in the degree of vacuum of the vacuum valve. This will greatly contribute to the maintenance of the vacuum valve.

The nature, principle, and utility of the invention will be more clearly understood from the following detailed description of the invention when read in conjunction with the accompanying drawings.

BRIEF DESCRIPTION OF THE DRAWING(S)

DETAILED DESCRIPTION OF THE INVENTION

Preferred embodiments of this invention will be described with reference to the accompanying drawings.

Figure 1:
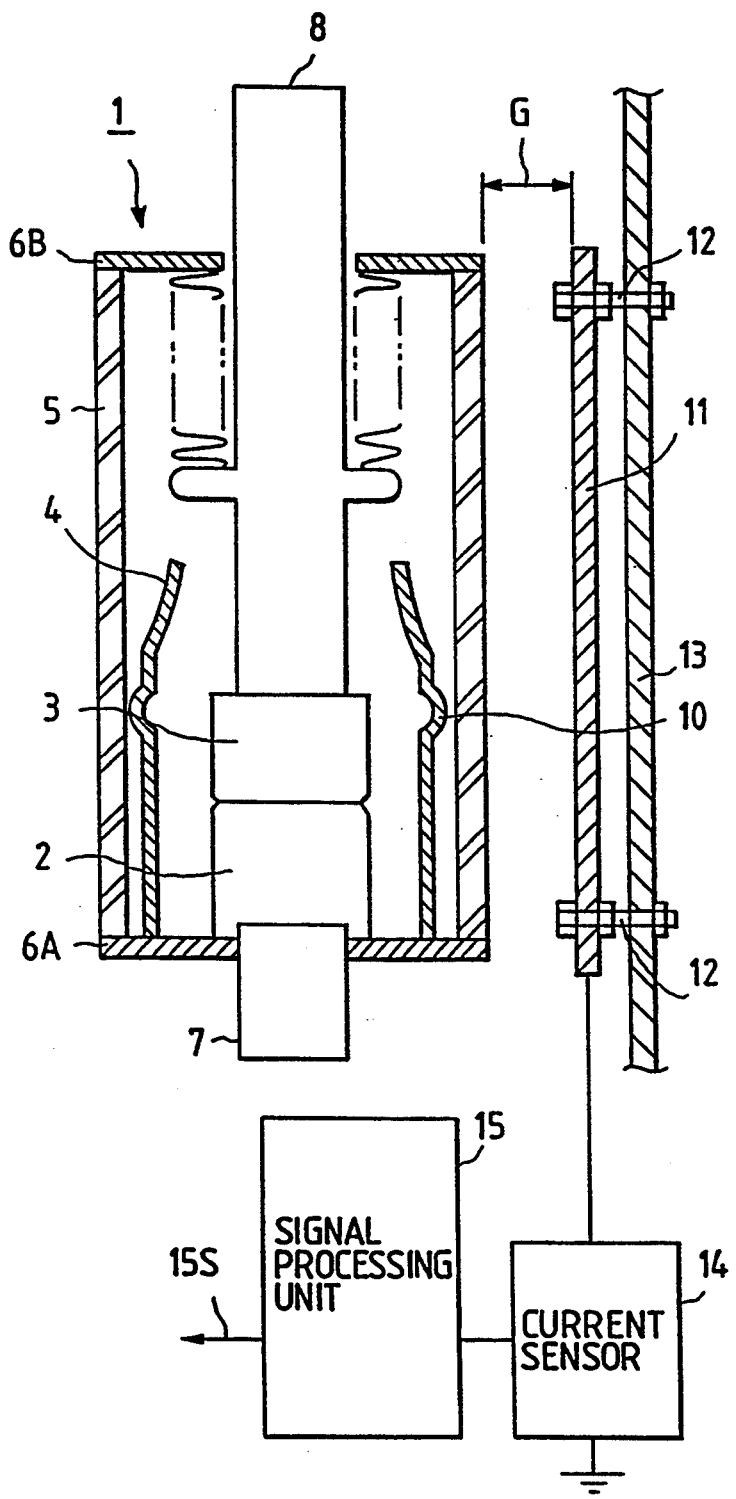
FIG. 1 is a sectional view showing an example of a vacuum reduction detecting device for a vacuum valve, which constitutes a first embodiment of the invention.
Figure 7:
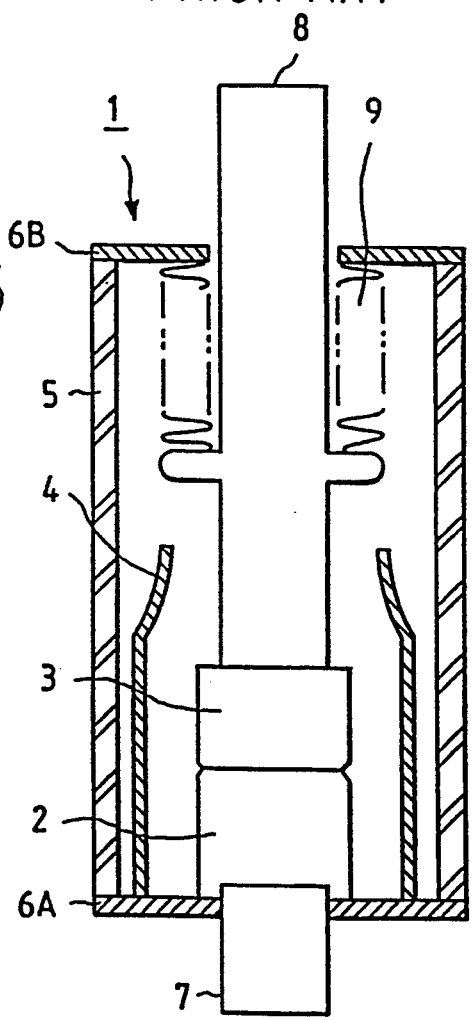
FIG. 7 is a sectional view showing essential parts of the vacuum circuit breaker shown in FIG. 6.

First, a device for detecting a reduction in the degree of vacuum of a vacuum valve (hereinafter referred to as "a vacuum reduction detecting device"), which constitutes a first embodiment of the invention, will be described with reference to FIG. 1. The device is formed for detection of a reduction in the degree of vacuum (hereinafter referred to as "a vacuum reduction", when applicable) of the vacuum valve as shown in FIG. 7. However, in the vacuum valve, as shown in FIG. 1, an annular protrusion 10 is formed on the outer cylindrical wall of the arc shield 4, which is secured to the lid 6A and is at the same potential as the stationary electrode 2, and a detecting electrode 11 is mounted on an insulating frame 13 in such a manner that there is an air gap G between the electrode 11 and the insulating container 5. More specifically, the detecting electrode 11 is secured to the insulating frame 13 with insulating bolts 12, and is grounded through a current sensor 14. The output of the current sensor 14 is applied to a signal processing unit 15, which outputs an alarm signal 15S.

In order to describe the vacuum reduction detecting theory of the device shown in FIG. 1, first a vacuum insulation characteristic and a partial discharge characteristic will be described.

Figure 8:
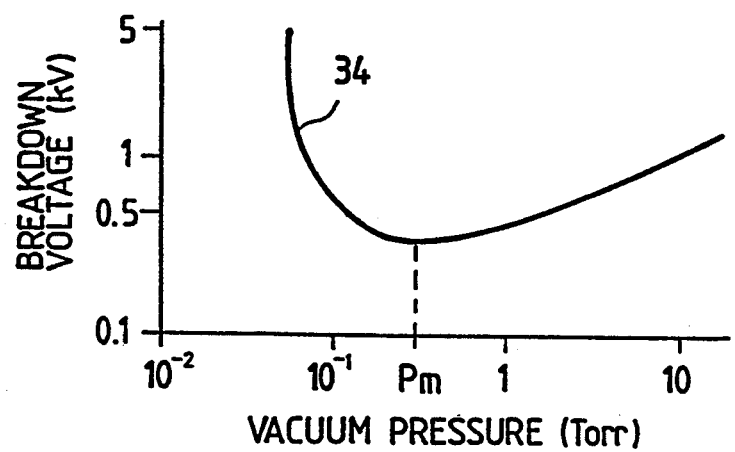
FIG. 8 is a graphical representation indicating relationships between vacuum pressures and breakdown voltages in vacuum insulation.

FIG. 8 is a characteristic diagram showing relationships between vacuum pressure and breakdown voltage with respect to vacuum insulation. In FIG. 8, the horizontal axis represents vacuum pressures (Torr), and the vertical axis breakdown voltages (kV). Further in FIG. 8, the characteristic curve 34 is for the case in which the gap length is 7 mm. The characteristic curve 34 is V-shaped, and called "Paschen curve". It is known that the Paschen curve will become one curve when the horizontal axis represents the products of vacuum pressures and gap lengths. As is apparent from FIG. 8, the breakdown voltage is minimum when the vacuum pressure is at about 0.3 Torr. Let us call this minimum breakdown voltage as "Paschen minimum", and it is assumed that the vacuum pressure corresponding to the Paschen minimum is represented by Pm. The vacuum pressure Pm is shifted towards the higher side as the gap length increases. In this connection, it should be noted that the vacuum pressure is, in general, understood as follows: When the vacuum pressure is small in value, the degree of vacuum is high; whereas when it is large, the degree of vacuum is low (a reduction in the degree of vacuum).

As was described before, normally the inside of the vacuum valve is high in the degree of vacuum, the vacuum pressure being smaller than $10^{-4}$ Torr. This condition is in the left region in FIG. 8 which is far away from Pm, and therefore the interior of the insulating container is considerably high in dielectric strength. However, when a vacuum reduction occurs with the vacuum valve, the dielectric strength is gradually decreased, and finally the Paschen minimum pressure is reached.

In general, even when a vacuum reduction occurs with the vacuum valve, the vacuum pressure scarcely reaches several tens of Torr or higher exceeding the Paschen minimum pressure Pm. The vacuum pressure reaches several tens of Torr only when the vacuum valve is broken, or the lid is removed; that is, when a large hole is formed in the vacuum valve. This defect can be readily found by visual inspection. In the case where the vacuum valve has an extremely small break, the vacuum reduction advances extremely slowly. Therefore, even if a vacuum reduction occurs with the vacuum valve, the vacuum pressure is generally held around the Paschen minimum value Thus, it is essential for the vacuum reduction detecting device to detect a reduction in the degree of vacuum in the vacuum valve before the vacuum pressure reaches the Paschen minimum value.

When a vacuum reduction occurs with the vacuum valve, the dielectric strength in vacuum is decreased, and the vacuum is partially broken before it is broken in its entirety; that is, parts of the vacuum are broken first where the electric field strength is high, thus following partial discharges. As the electric field increases, the range of pressures with which partial discharges are induced, is increased, as a result of which partial discharges are induced with lower vacuum pressures.

Figure 9:
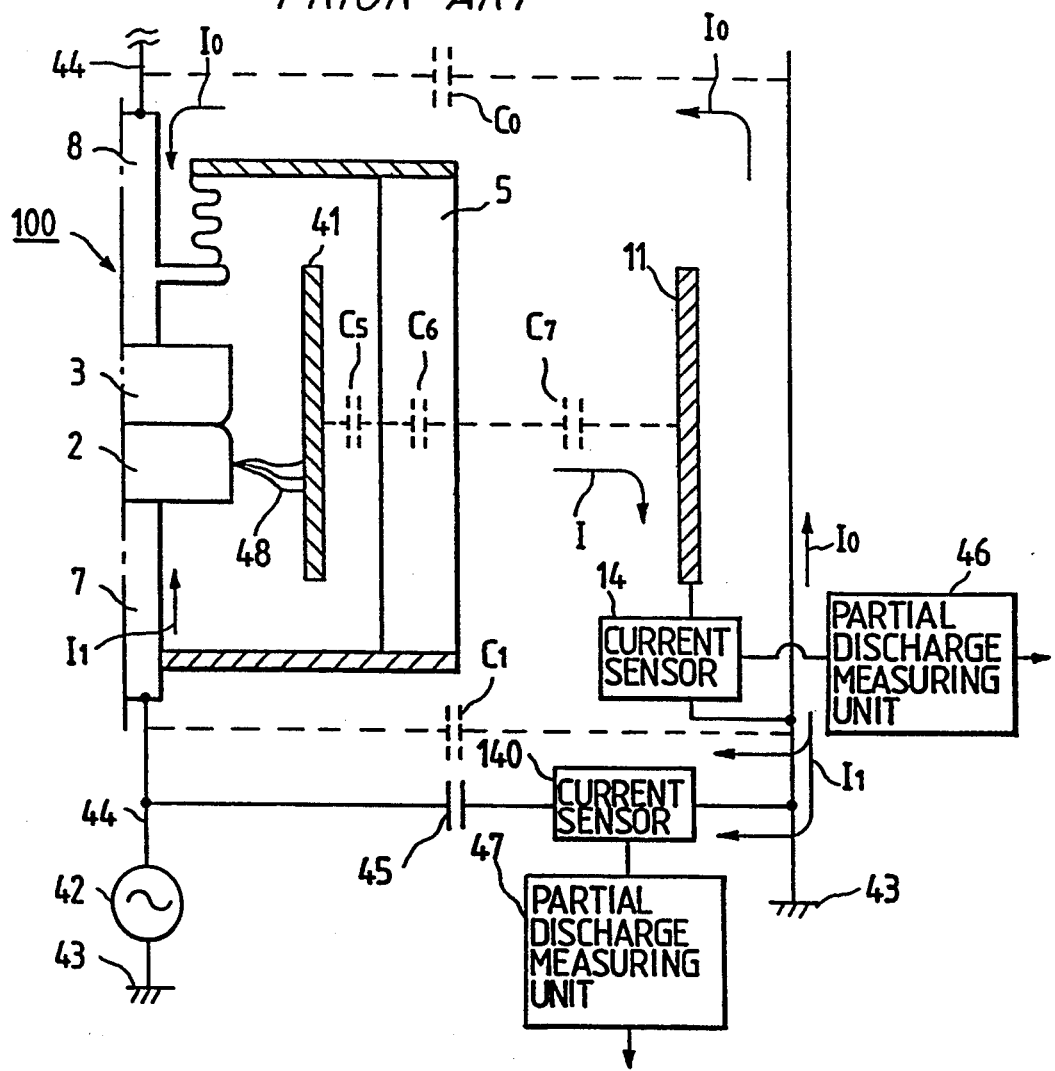
FIG. 9 is an explanatory diagram showing a vacuum valve partial discharge detecting circuit.

FIG. 9 shows a conventional partial discharge measuring circuit for a vacuum valve. In FIG. 9, one half of a vacuum valve 100 is shown, and its stationary electrode 2 and movable electrode 3 are accommodated in an insulating container 5, and are engaged with each other; that is, contact means made up of the two electrodes 2 and 3 is turned on, and an arc shield 41 is an intermediate electrode which is insulated from those electrodes. The vacuum valve 100 is connected to a circuit conductor 44 to a system power source 42. For measurement of partial discharges, a detecting electrode 11 is confronted with the vacuum valve 100, and it is connected to a grounding line 43 through a current sensor 14. The circuit conductor 44 is connected to a capacitor 45, which is connected through a sensor 140 to the grounding line 43. The outputs of those sensors 14 and 140 are connected to partial discharge measuring units 46 and 47, respectively.

In the above-described circuit, electrostatic capacities exist as indicated by the dotted lines. That is, in FIG. 9, $C_0$ and $C_1$ designate the electrostatic capacities which are formed between the main circuit conductors 44 connected to the main circuit terminals of the vacuum valve 100 and the grounding line 43; that is, they represent the capacities between ground and elements such as loads, cables and other electric power equipment. Furthermore, reference characters $C_5$, $C_6$ and $C_7$ designate the electrostatic capacity between the arc shield 41 and the inner cylindrical surface of the insulating container 5, the one between the inner and outer cylindrical surface of the insulating container 5, and the one between the outer cylindrical surface of the insulating container 5 and the detecting electrode 11, respectively. In addition, electrostatic capacities exist between ground and the stationary lead 7 and the movable lead 8. Such electrostatic capacities are included by the above-described electrostatic capacities $C_0$ and $C_1$.

It is assumed that, in FIG. 9, a vacuum reduction occurs with the vacuum valve 100, and partial discharges are induced between the arc shield 41 and the stationary electrode 2 as indicated at 48. The partial discharges abruptly change the potential difference between the arc shield and the stationary electrode 2, thus forming a displacement current, namely, a discharge current I. The discharge current I flows through the electrostatic capacities $C_5$, $C_6$ and $C_7$ to ground. On the other hand, the discharge current I is divided into two currents $I_0$ and $I_1$. The current $I_0$ flows through the electrostatic capacity $C_0$ to the stationary electrode 2, while the current $I_1$ flows through the electrostatic capacity $C_1$ and the coupling capacitor 45 to the stationary electrode 2. Whenever the partial discharge 48 occurs, the divided discharge currents will flow through the current sensors 14 and 140. The divided discharge currents are amplified and measured by the partial discharge measuring units 46 and 47, respectively. However, in measuring the discharge current, it is unnecessary to provide two current sensors. In the measurement with the current sensor 14 only, the coupling capacitor 45 may be eliminated. When only the current sensor 14 is used, the detecting electrode 11 may be eliminated. In this case, the electrostatic capacity $C_7$ is formed between the outer cylindrical surface of the insulating container 5 and the grounding line 43. In the above-described case, the contact means of the vacuum valve 1 is closed; however, even in the case where the contact means is held opened, the partial discharge measuring circuit is maintained unchanged in arrangement except that an electrostatic capacity is formed between the stationary electrode 2 and the movable electrode 3. That is, the discharge current $I_0$ flows through this electrostatic capacity to the stationary electrode 2.

The current sensors 14 and 140 may be those which have been disclosed by the following literature (1):

Electric Society, Japanese Electrotechnical Committee Standard "Partial Discharge Measurement, General—JEC-195 (1980)"

Figure 10:
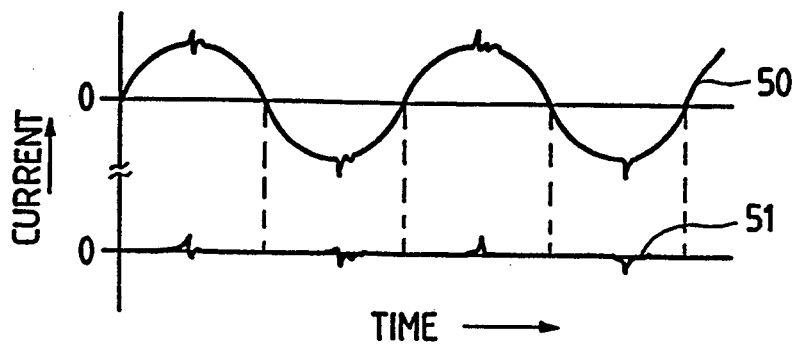
FIG. 10 is a time chart showing discharge currents.

FIG. 10 is a time chart showing the discharge currents detected by the current sensor 14 shown in FIG. 9. A charge current of commercial frequency and voltage flows from the system power source 42 into the current sensor 14, so that the discharge currents are superposed on it. In FIG. 10, the upper waveform 50 shows the discharge currents superposed on the charge current, and the lower waveform 51 shows only the discharge currents. The lower waveform 51 has steep parts, namely, high frequency components at intervals of half cycle, which correspond to the discharge currents. The partial discharges occur in a pulse mode, and the waveform 51 contains frequency components of from low frequency to several tens of mega-hertz (MHz).

The waveform of the discharge current detected by the sensor 140 is different from that of the discharge current detected by the sensor 14 only in that the former is opposite in polarity to the latter; that is, the former waveform is the same in tendency as the latter.

Partial discharges may be induced between the electrodes of the vacuum valve which are held open, and between the arc shield 41 and the movable electrode 3 as well as between the stationary electrode 2 and the arc shield 41. In all of those cases, the discharge currents can be detected with the current sensor 14 or 140 in the circuit shown in FIG. 9.

Figure 11:
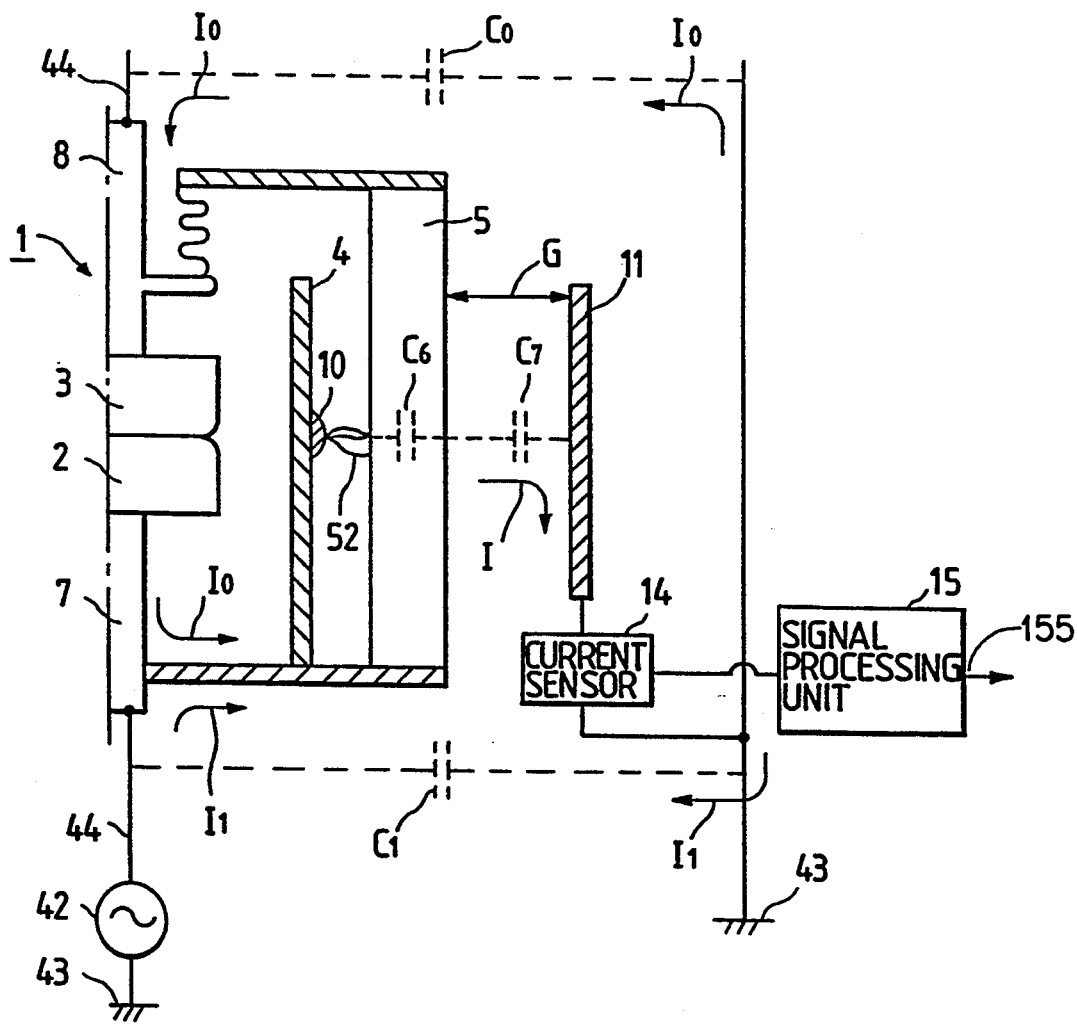
FIG. 11 is an explanatory diagram showing a partial discharge detecting circuit in the first embodiment shown in FIG. 1.

FIG. 11 shows a partial discharge measuring circuit in the first embodiment shown in FIG. 1. The circuit of FIG. 11 is different from the circuit of FIG. 9 only in that the arc shield 4 connected electrically to the side of the stationary electrode 2 has a protrusion 10, and the discharge current is detected only through the detecting electrode 11 which is confronted with the insulating container 5 with an air gap G therebetween.

In the case where the air gap G is so determined that the electric field at the protrusion 10 is as high as possible (the gap G being several tens of milli-meters (mm) in the case of a 7 kV vacuum valve), the connection of the system power source 42 to the vacuum valve causes no partial discharges if the vacuum valve is sufficiently high in the degree of vacuum. However, if, in this case, a vacuum reduction occurs with the vacuum valve, the vacuum is decreased at the end of the protrusion 10, and partial discharges are therefore induced between the protrusion and the insulating container as indicated at 52, so that the potential difference therebetween is abruptly changed. Thus, similarly as in the case of FIG. 9, the discharge current I flows to ground through the electrostatic capacities $C_6$ and $C_7$. The discharge current I is divided into two parts $I_0$ and $I_1$, which return to the vacuum valve 1. In this case, the discharge current waveform is substantially equal to the one shown in FIG. 10. In response to the discharge current, partial discharge measuring means; i.e., the signal processing unit 15 outputs an alarm signal 15S indicating the vacuum reduction.

In the circuit shown in FIG. 11, the commercial frequency current flows to the detecting electrode 11. Therefore, the signal processing unit 15 includes a circuit for removing the commercial frequency components.

The discharge currents have a pulse waveform. Therefore, the signal processing unit 15 detects the pulse waveform only, and converts it into the alarm signal 15S. Hence, the signal processing unit 15 provides the alarm signal 15S only when discharges are induced with the vacuum valve which is in operation.

The current sensor 14 may be a transformer excellent in high frequency characteristic. The signal processing unit 15 may be a partial discharge measuring unit which is available on the market. The alarm signal 15S may be utilized to operate an alarm system, or to display the magnitude or the frequency of occurrence of the partial discharges on a display unit.

Referring back to FIG. 1, similarly as in the case of FIG. 11, the partial discharges induced at the end of the protrusion 10 are detected through the detecting electrode 11 by the current sensor 14. The formation of the protrusion 10 on the arc shield 4 is a novel technique proposed by the inventor. By setting the air gap G to a suitable value, the range of pressures causing partial discharges at the protrusion 10 can be increased; that is, the vacuum reduction can be detected with higher sensitivity. That is, as the air gap G decreases, the electric field at the end of the protrusion 10 is increased, and therefore the minimum vacuum pressure to induce partial discharges is decreased. Thus, the device has the following merit: In the case where a vacuum reduction occurs with a vacuum valve which has been high in the degree of vacuum, and the vacuum pressure is gradually increased, the device can detect the defect before the degree of vacuum of the vacuum valve is greatly reduced.

Japanese Patent Application (OPI) No's 76630/1989 and 114413/1990 (the term "OPI" as used herein means an "unexamined published application") have disclosed a vacuum reduction detecting device which detects partial discharges by using a current sensor which is interposed between a detecting electrode and ground. In the conventional device, its arc shield has no protrusion; that is, the vacuum valve is not modified at all, for detection of partial discharges; more specifically, partial discharges between the arc shield and the stationary electrode are detected as shown in FIG. 9. With the device, the range of pressures with which partial discharges are induced cannot be adjusted unless the internal structure of the vacuum valve is changed. Furthermore, in the case where, as shown in FIG. 1, the arc shield 4' and the stationary electrode 2 are at the same potential, no partial discharge is induced therebetween, and therefore partial discharges between the arc shield 4 and the movable electrode 3 or between the stationary electrode 2 and the movable electrode 3 are detected. The occurrence of partial discharges at the movable electrode 3 depends on the operating conditions of the contact means. Therefore, in this case, it is difficult to monitor the reduction in the degree of vacuum at all times.

In the case of the device shown in FIG. 1, the protrusion 10 is formed on the arc shield in the vacuum valve during manufacture, and therefore the vacuum valve is not affected in reliability; that is, it is positively prevented from being reduced in the degree of vacuum. Even if, in order to support the vacuum valve, other insulators are set in the air gap G, they will never adversely affect the vacuum reduction detecting operation.

Figure 2:
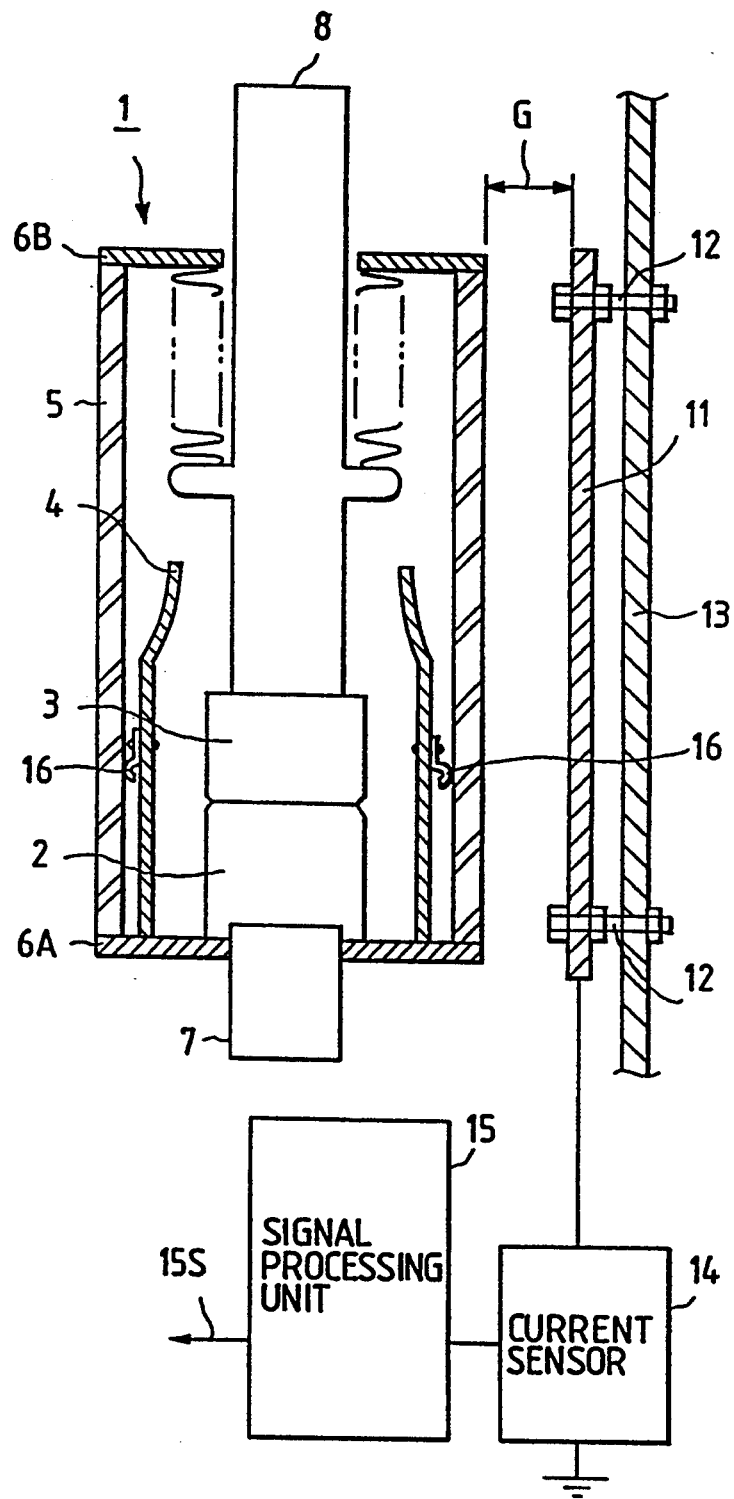
FIG. 2 is a sectional view showing another example of the vacuum reduction detecting device, which constitutes a second embodiment of the invention.

FIG. 2 shows another example of the vacuum reduction detecting device, which constitutes a second embodiment of the invention. The second embodiment is different from the above-described first embodiment (FIG. 1) in that, instead of the protrusion formed on the arc shield in the first embodiment, metal contact springs 16 are secured to the outer cylindrical surface of the arc shield 4 in such a manner that they are in contact with the inner cylindrical surface of the insulating container 5. In the first embodiment, the protrusion is annular; whereas in the second-embodiment, the contact springs 16, which are a plurality of leaf springs, are secured to the outer cylindrical surface of the arc shield 4 at equal intervals. In the case of FIG. 2, two contact springs 16 are secured to both sides of the arc shield 4 with rivets.

It is known in the art that, when a metal electrode contacts an insulator, then the electric field at the contact point is increased extremely (cf. Electric Society Ninth Insulating material Symposium Material III-I, pp 109–112, 1976, Takuma et al). Hence, with this structure shown in FIG. 2, partial discharges are induced under the vacuum pressure in the insulating container which is lower than in the first embodiment. Therefore, the vacuum reduction can be detected with higher sensitivity.

In the second embodiment, the partial discharge is a creeping discharge which spreads from the ends of the contact springs 16 along the inner surface of the insulating container 5. Therefore, in order to induce the discharge stably, it is essential that the metal electrode is positively held in contact with the insulator. The contact springs 16 formed as shown in FIG. 2 are positively held in contact with the insulating container 5. During manufacture of the vacuum valve 1, the contact springs 16 are secured to the arc shield 4 with rivets in advance, and the arc shield 4 with the contact springs 16 is inserted into the insulating container 5 while the contact springs 16 are being slid on the inner surface of the insulating container. Hence, the vacuum valve can be formed with ease.

Figure 3:
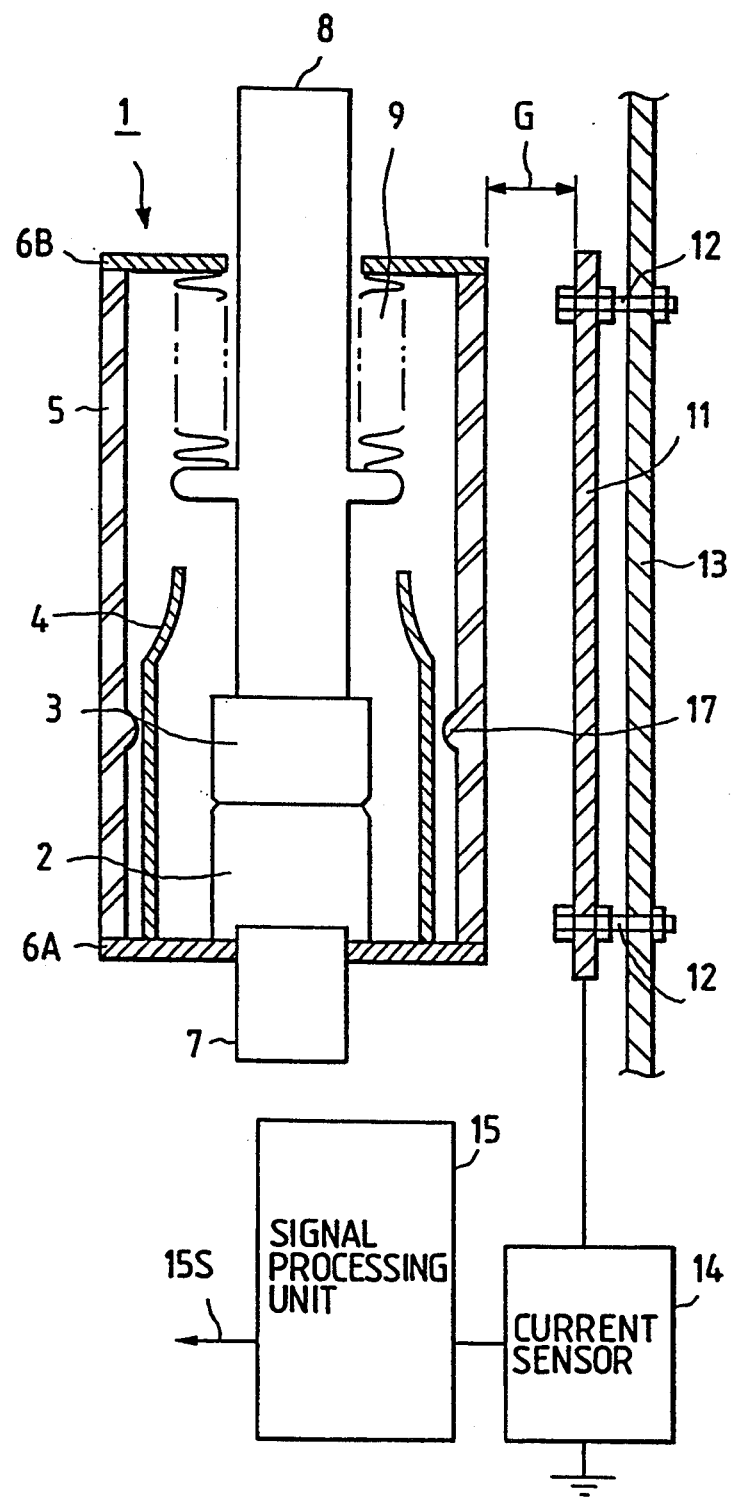
FIG. 3 is a sectional view showing another example of the vacuum reduction detecting device, which constitutes a third embodiment of the invention.

FIG. 3 shows another example of the vacuum reduction detecting device, which constitutes a third embodiment of the invention. The third embodiment is different from the first embodiment shown in FIG. 1 only in that an annular protrusion 17 is formed on the inner cylindrical surface of the insulating container 5. The annular protrusion 17 may be made of a metal material, or, as shown in FIG. 3, it may be made of the same material as the insulating container 5. The insulating container 5 is generally made of a porcelain material high in dielectric constant, and therefore the electric field at the end of the protrusion 17 is high. Thus, similarly as in the case of the protrusion of metal, partial discharges are induced from the protrusion 17 towards the arc shield 4 as the vacuum pressure in the insulating container 5 increases. The discharge current, being of high frequency, flows through the air gap G to the detecting electrode 11, and therefore the vacuum reduction of the vacuum valve can be detected. The protrusion 17 and the insulating container 15 can be formed as one unit by molding. Therefore, the provision of the protrusion 17 will not increase the manufacturing cost. In addition, similarly as in the above-described first and second embodiments, the vacuum valve is high in reliability; that is, it is positively prevented from vacuum reduction.

In the above-described first, second and third embodiments, the arc shield has the same potential as the stationary electrode 2. However, even in the case where the arc shield 4 is provided as an intermediate electrode insulated from the stationary electrode 2 and the movable electrode 3, the same effect can be obtained by forming the above-described protrusion on the outer cylindrical surface of the arc shield 4 or on the inner cylindrical surface of the insulating container 5.

In the case of a vacuum circuit breaker with three vacuum valves 1 of three phases, the vacuum reduction detecting device may be formed as follows: That is, the detecting electrodes 11 are set confronted with the vacuum valves 1, respectively, and the conductors extended from the detecting electrodes 11 are connected to one current sensor 14, which is connected to one signal processing unit 15. With the device, three vacuum valves 1 can be monitored for vacuum reduction. However, it is impossible for the device to determine which of the vacuum valves is defective, reduced in the degree of vacuum. However, even if only one of the vacuum valves becomes out of order, the vacuum circuit breaker cannot be used. Therefore, in this case, the maintenance of the vacuum circuit breaker can be satisfactorily achieved by testing each vacuum valve with the vacuum circuit breaker turned off.

Figure 4:
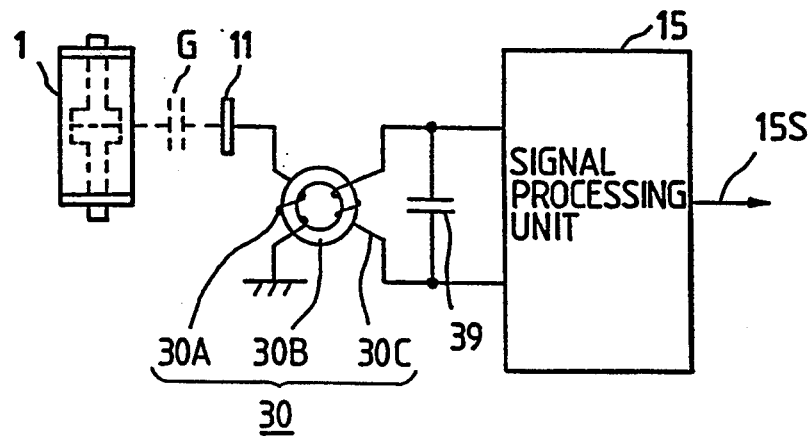
FIG. 4 is a sectional view showing another example of the vacuum reduction detecting device, which constitutes a fourth embodiment of the invention.

FIG. 4 shows another example of the vacuum reduction detecting device, which constitutes a fourth embodiment of the invention.

A detecting electrode 11 is confronted with the vacuum valve 1 with an air gap therebetween; that is, the former 11 is coupled through an electrostatic capacity (indicated by the dotted line) to the latter 1. The detecting electrode 11 is connected to a current sensor, namely, a current transformer 30. The current transformer 30 comprises a ferrite core 30B excellent in high frequency characteristic, and a primary winding 30A and a secondary winding 30C which are wound on the ferrite core 30B. One end of the primary winding 30A is connected to the detecting electrode 11, and the other is grounded. The secondary winding 30C is shunted with a resonance capacitor 39, and connected to the input side of the signal processing unit 15. The capacitance of the resonance capacitor 39 is so selected that the capacitor is tuned to a current component of a particular frequency $f_1$ (150 kHz for instance) in a range of from 100 kHz to 200 kHz of the discharge current which flows in the primary winding 30A of the current transformer 30.

In the circuit of FIG. 4, of the discharge current attributing to a vacuum reduction of the vacuum valve 1, the current components of about the particular frequency $f_1$ are allowed to flow to the signal processing unit 15, which outputs an alarm signal 15S.

Figure 12:
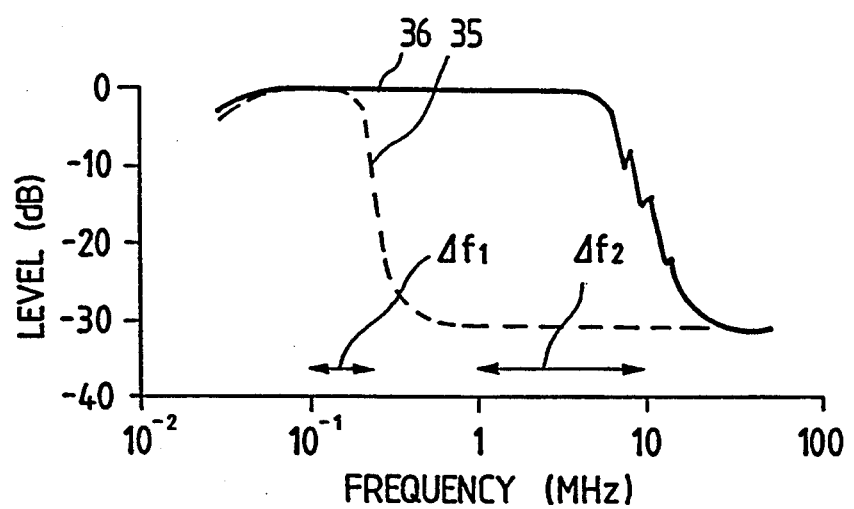
FIG. 12 is a graphical representation indicating frequency spectra of discharge currents.

The reason why the value of the resonance capacitor 39 is so selected that the capacitor is tuned to the particular frequency $f_1$ will be described:

FIG. 12 is a characteristic diagram indicating the frequency spectra of discharge currents in the second embodiment (FIG. 2). In FIG. 12, the horizontal axis represents frequencies on logarithmic scale, and the vertical axis represents frequency component levels in dB (0 dB corresponding to the level provided when the frequency is 100 kHz). The characteristic curve 35 is obtained when the vacuum pressure is 0.3 Torr (near Pm), and the characteristic curve 36 is obtained when 0.05 Torr. In the characteristic curve 35, the level is abruptly decreased when the frequency is increased to about 300 kHz. On the other hand, in the characteristic curve 36, the level is substantially constant until the frequency reaches about 10 MHz. This characteristic tendency has been found by the inventor. When the vacuum pressure is about the Paschen minimum pressure (for instance, in a range of from 0.1 Torr to 10 Torr), the discharge current frequency spectrum is as indicated by the characteristic curve 35; and when the vacuum pressure is out of the range, the spectrum is as indicated by the characteristic curve 36. That is, the current components whose frequencies are in the frequency range $\Delta f_1$ (100 kHz to 200 kHz) shown in FIG. 2 exist in all the discharge currents irrespective to the range of vacuum pressures; whereas the current components whose frequencies are in a frequency range $\Delta f_2$ (1 MHz to 10 MHz) scarcely exist in the discharge currents provided when the vacuum pressures are around the Paschen minimum pressure Pm.

Referring back to FIG. 4, if the tuning frequency of the current transformer 30 is set to a frequency $f_1$ (150 kHz for instance) in the frequency range $\Delta f_1$ shown in FIG. 12, then even when the vacuum pressure is extremely increased by the reduction in the degree of vacuum of the vacuum valve 1, the reduction in the degree of vacuum can be detected positively. In the fourth embodiment (FIG. 4), the current transformer 30 is employed as the current sensor, as was describe above. The current transformer 30 is excellent as a sensor which operates according to a narrow band tuning method (one of the partial discharge measuring methods described in the aforementioned literature (1)) in which a particular frequency is tuned for detection of a partial discharge. That is, when a charging current of commercial frequency (50 or 60 Hz) flows in the current transformer, it will not appear in the secondary side. Therefore, it is unnecessary for the signal processing unit 15 to have the high-pass filter which is necessary for the resistance sensor to have. Since the narrow band tuning is employed, the amplification band width may be small, and therefore the gain of the amplifier can be obtained readily, and the detecting device can be simplified in arrangement as much. Furthermore, in the current transformer 30, the primary winding and the secondary winding are insulated from each other. Therefore, the detecting device and the electric power system can be grounded separately. This arrangement is advantageous in that the detecting device is free from the surge in the electric power system; that is, the protection of the detecting device is improved as much.

Japanese Patent Application (OPI) No's 46725/1984, 46726/1984 and 175524/1984 have disclosed vacuum reduction detecting devices in which, as shown in FIG. 9, discharge current flowing through the coupling capacitor 45 is detected with the current sensor 140, and partial discharges are detected with a band-pass filter which transmits frequency components of from 2 kHz to 20 kHz, or from 2 kHz to 400 kHz. The detecting device of the invention is different from those conventional devices in the following points:

(1) In the case of the conventional detecting devices, no protrusion is formed on the arc shield, and the conventional vacuum valve is used as it is for detection of partial discharges in it.

(2) In the case of the conventional detecting devices, the discharge current is detected through the coupling capacitor. As for the coupling capacitor, a detector or insulated operating rod connected to the main circuit conductor is utilized.

(3) The conventional detecting devices employ the band-pass filter to detect discharge current components whose frequencies are in the particular frequency range. The reason for the provision of the particular frequency range is that, when the partial discharges were measured with the vacuum pressure of the vacuum valve changed from $5 \times 10^{-3}$ Torr to 300 Torr, frequency components of 2 kHz to 20 kHz were obtained. The inventor has found it through experiments that, as shown in FIG. 12, even in the Paschen minimum pressure region, the frequency components of discharge currents are ranged from low frequencies to high frequencies of the order of 200 kHz. In the case where the band pass filter is used to transmit a wide range of frequency components, it is not simple to obtain the gain of the amplifier. Hence, in order to simplify the arrangement of the detecting device, only the discharge current components whose frequencies are in the particular frequency range should be detected.

The aforementioned literature (1) has described a partial discharge measuring unit operating according to the narrow band tuning method, in which a tuning transformer is connected, as a current sensor, in parallel to a resistor, and the tuning frequency is in a particular frequency range of from 200 kHz to several mega-hertz (MHz). When the literature (1) was published, the phenomenon of the Paschen minimum with the vacuum insulation was not known yet. Therefore, the literature (1) shows no measuring unit whose tuning frequency is lower than 200 kHz.

Figure 5:
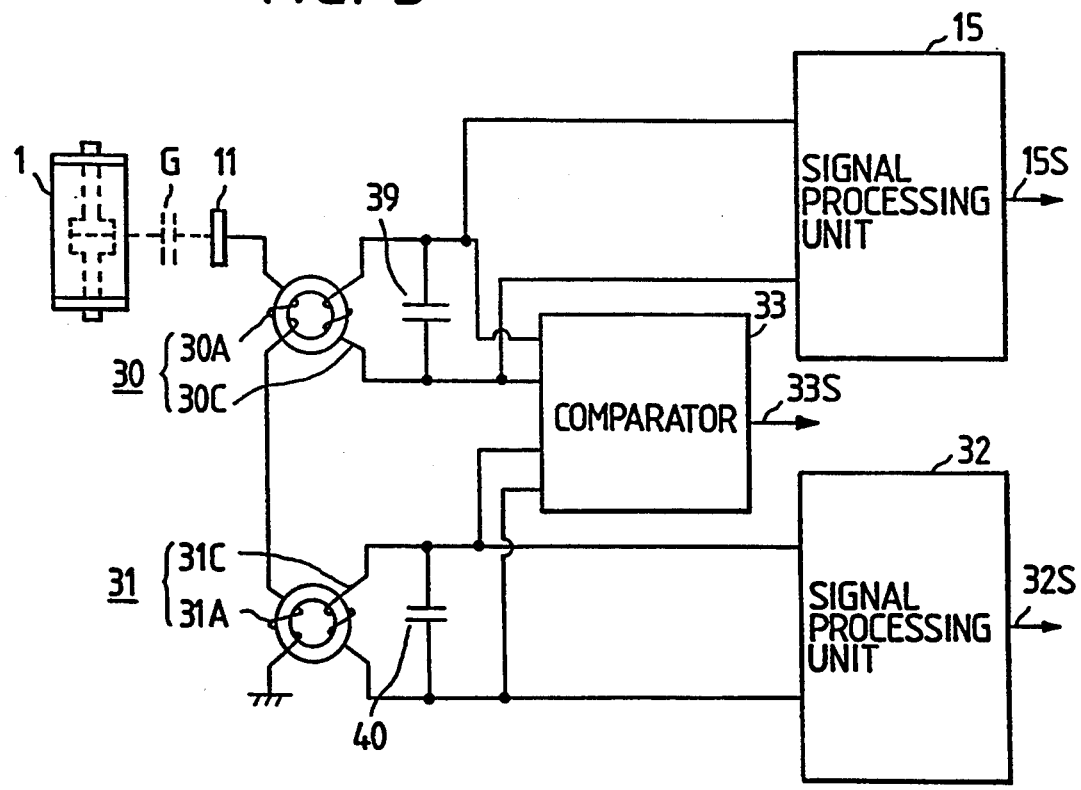
FIG. 5 is a sectional view showing another example of the vacuum reduction detecting device, which constitutes a fifth embodiment of the invention.
Figure 6:
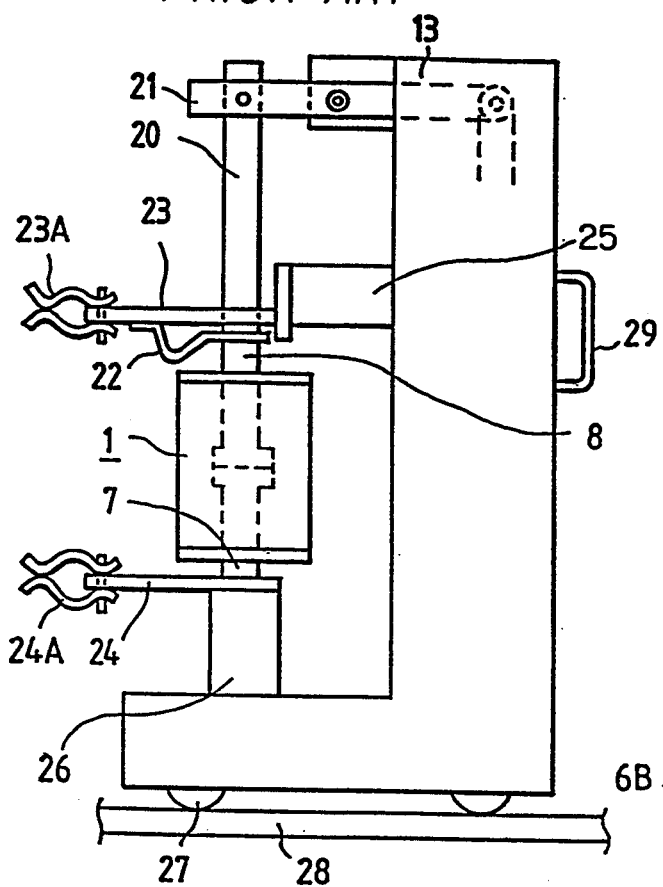
FIG. 6 is a side view showing the arrangement of a vacuum circuit breaker.

FIG. 5 shows another example of the vacuum reduction detecting device, which constitutes a fifth embodiment of the invention.

Roughly stated, the fifth embodiment is formed by adding a current transformer 31 and a signal processing unit 32, which are similar to those 30 and 15 in the fourth embodiment (FIG. 4), and a comparator 33 to the fourth embodiment. The primary winding 31A of the current transformer 31 is connected in series to the primary winding 30A of the current transformer 30. The secondary winding 31C of the current transformer 31 is shunted with a resonance capacitor 40, and connected to the input side of the signal processing unit 32. Furthermore, the secondary windings 30C and 31C of the current transformers 30 and 31 are connected to the input side of the comparator 33. In the comparator 33, the levels of the output signal of the current transformers 30 and 31 are subjected to comparison. When the output signal level of the current transformer 30 is higher than that of the current transformer 31, the comparator 33 outputs a signal 33S indicating the amount of reduction in the degree of vacuum of the vacuum valve. The other arrangements are equal to those in the fourth embodiment shown in FIG. 4.

The capacitance of the resonance capacitor 40 is so selected that the capacitor is tuned to a current component of a particular frequency $f_2$ (3 MHz for instance) in a range of from 1 MHz to 10 MHz of the discharge current which flows in the primary winding 31A of the current transformer 31. The outputting of the signal 3S by the comparator 33 means that the vacuum reduction of the vacuum valve 1 has been advanced to about the Paschen minimum pressure Pm. On the other hand, when the comparator outputs no signal 33A although the signal processing units 15 and 32 output the alarm signals 15S and 32S, the vacuum pressure of the vacuum valve 1 has not come near the Paschen minimum pressure Pm yet.

As was described above, according to the invention, the protrusion is formed on the outer cylindrical surface of the arc shield or the inner surface of the insulating container in the vacuum valve, and the detecting electrode is set confronted with the outer surface of the insulating container with the air gap therebetween. This makes it possible to monitor a reduction in the degree of vacuum of the vacuum valve which is in operation, with the vacuum valve maintained unchanged in reliability. The protrusion on the insulating container is formed in advance simultaneously when the latter is formed; that is, the protrusion and the insulating container are manufactured as one unit, and therefore the formation of the protrusion will not increase the manufacturing cost of the vacuum tube at all. By adjusting the length of the air gap, the range of pressures with which partial discharges are induced can be increased; that is, the sensitivity to a vacuum reduction can be increased.

In addition, the protrusion on the arc shield is held in contact with the inner surface of the insulating container. Since, at the contact region, the electric field is made extremely high, and the vacuum reduction can be detected with higher sensitivity.

Furthermore, the contact springs of metal are employed as the protrusion. Therefore, when the arc shield is inserted into the insulating container, the contact springs contact the insulating container positively. Thus, when the degree of vacuum of the vacuum valve is reduced, discharge currents are stably induced.

Moreover, the current transformer whose secondary winding is shunted with the resonance capacitor is employed as the current sensor. The capacitance of the resonance capacitor is so selected that the capacitor is tuned to a particular frequency component in a range of frequencies of from 100 kHz to 200 kHz. Therefore, even when the vacuum pressure is the Paschen minimum pressure, the discharge can be detected. Hence, a vacuum reduction of the vacuum valve can be detected irrespective of the vacuum pressure.

Furthermore, according to the invention, the current sensor is made up of the first and second current transformers, the secondary windings of which are shunted with the resonance capacitors. One terminal of the primary winding of the first current transformer is connected to the detecting electrode, and the other terminal is connected to the primary winding of the second current transformer. The first current transformer is tuned to a particular frequency component in a frequency range of from 100 kHz to 200 kHz, while the second current transformer is tuned to a particular frequency component in a frequency range of from 1 MHz to 10 MHz. The comparator subjects the levels of the output signals of the two current transformers to comparison, to provide the output signal when the former is large than the latter. Thus, it can be determined from the presence or absence of the output signal of the comparator whether or not a vacuum reduction occurs with the vacuum valve. That is, it can be determined immediately whether or not the vacuum pressure is decreased to the Paschen minimum valve. This will greatly contribute to the improvement in maintenance of the vacuum valve.

While there has been described in connection with the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A method of detecting a reduction in the degree of vacuum of a vacuum valve having: an insulating container which is evacuated; contact means made up of a movable electrode and a stationary electrode; an arc shield having outer cylindrical surface and electrically connected to one of said electrodes; and a protrusion formed on the outer cylindrical surface of said arc shield or on the inner surface of said insulating container; and a detecting electrode confronted with the outer surface of said insulating container so as to provide an air gap therebetween and grounded through a current sensor for detecting a discharge current induced between said protrusion and said container; said contact means and said arc shield being set in said insulating container in such a manner that said arc shield surrounds said contact means, said method comprising the steps of:

holding said arc shield at the same potential as one of said movable and stationary electrodes; and detecting a discharge current which is induced through said protrusion by said current sensor when the degree of vacuum of said vacuum valve is reduced, thereby to detect the reduction in the degree of vacuum of said vacuum valve.

2. A method as claimed in claim 1, further comprising the step of generating an alarm signal in response to detection of the reduction.

3. A device for detecting a reduction in the degree of vacuum of a vacuum valve, comprising:
- an insulating container which is evacuated;
- contact means made up of a movable electrode and a stationary electrode;
- an arc shield electrically connected to one of said electrodes and having a protrusion formed on the outer surface thereof and surrounding said contact means, said contact means and said arc shield being set in said insulating container;
- a detecting electrode confronted with the outer surface of said insulating container so as to provide an air gap therebetween; and
- a current sensor for detecting a discharge current which is induced through said protrusion when the degree of vacuum of said vacuum valve is reduced and outputting detection signal, said detecting electrode being grounded through said current sensor.

4. A device as claimed in claim 3, further comprising a signal processing unit which, in response to said detection signal of said current sensor, outputs an alarm signal to indicate the reduction in the degree of vacuum of said vacuum valve.

5. A device as claimed in claim 3, wherein said arc shield is at the same potential as one of said movable and stationary electrodes.

6. A device as claimed in claim 3, wherein said protrusion is in contact with the inner surface of said insulating container.

7. A device as claimed in claim 6, wherein said protrusion comprises a contact spring of metal.

8. A device as claimed in claim 3, wherein said current sensor comprises a current transformer having a primary winding on an input side and a secondary winding on an output side; said secondary winding is shunted by a resonance capacitor; and said current transformer outputs a signal tuned to a particular frequency component in a frequency range of from 100 kHz to 200 kHz of the discharge current.

9. A device as claimed in claim 3, wherein said current sensor comprises first and second current transformers each having a primary winding on an input side and a secondary winding on an output side; one terminal of said primary winding of said first current transformer being connected to said detecting electrode, and the other terminal thereof being connected to said primary winding of said second current transformer; said secondary windings of said current transformers being shunted with resonance capacitors, respectively; said first current transformer outputting a signal tuned to a particular frequency component in a frequency range of from 100 kHz to 200 kHz, while said second current transformer outputs a signal tuned to a particular frequency component in a frequency range of from 1 MHz to 10 MHz; a comparator for subjecting the levels of said signals outputted by said first and second current transformers to comparison; said comparator outputting an alarm signal indicating an amount oF reduction in the degree of vacuum of said vacuum valve.

10. A device for detecting a reduction in the degree of vacuum of a vacuum valve, comprising:
- an insulating container which is evacuated and having a protrusion on the inner surface thereof;
- contact means made up of a movable electrode and a stationary electrode;
- an arc shield which surrounds said contact means and is electrically connected to one of said electrodes, said contact means and arc shield being set in said insulating container;
- a detecting electrode confronted with the outer surface of said insulating container so as to provide an air gap therebetween;
- a current sensor for detecting a discharge current which is induced through said protrusion when the degree of vacuum of said vacuum valve is reduced and outputting a detection signal, said detecting electrode being grounded through said current sensor; and
- a signal processing unit which, in response to said output of said current sensor, outputs an alarm signal to indicate the reduction in the degree of vacuum of said vacuum valve.

11. A device as claimed in claim 10, wherein said current sensor comprises a current transformer having a primary winding on an input side and a secondary winding on an output side; said secondary winding is shunted by a resonance capacitor; and said current transformer outputs a signal tuned to a particular frequency component in a frequency range of from 100 kHz to 200 kHz of the discharge current.

12. A device as claimed in claim 10, wherein said current sensor comprises first and second current transformers each having a primary winding on an input side and a secondary winding on an output side; one terminal of said primary winding of said first current transformer being connected to said detecting electrode, and the other terminal thereof being connected to said primary winding of said second current transformer; said secondary windings of said current transformers being shunted with resonance capacitors, respectively; said first current transformer outputting a signal tuned to a particular frequency component in a frequency range of from 100 kHz to 200 kHz, while said second current transformer outputs a signal tuned to a particular frequency component in a frequency range of from 1 MHz to 10 MHz; a comparator for subjecting the levels of said signals outputted by said first and second current transformers to comparison; said comparator outputting an alarm signal indicating an amount of reduction in the degree of vacuum of said vacuum valve.

* * * * *